United States Patent [19]
Javitt

[11] Patent Number: 5,559,842
[45] Date of Patent: Sep. 24, 1996

[54] NETWORK-CONTROLLED REFERENCE FREQUENCY GENERATOR

[75] Inventor: Joel I. Javitt, Hillside, N.J.

[73] Assignee: Lucent Technologies Inc., Murray Hill, N.J.

[21] Appl. No.: 220,351

[22] Filed: Mar. 30, 1994

[51] Int. Cl.$^6$ ................................................. H03D 3/24
[52] U.S. Cl. .............................................. 375/376; 327/147
[58] Field of Search ................................... 375/371, 373, 375/375, 376; 327/147, 150; 331/1 A; 370/102; 360/51

[56] References Cited

U.S. PATENT DOCUMENTS

| | | | |
|---|---|---|---|
| 4,594,563 | 6/1986 | Williams | 331/1 A |
| 4,787,096 | 11/1988 | Wong | 375/376 |
| 4,827,225 | 5/1989 | Lee | 375/376 |
| 4,833,425 | 5/1989 | Culican et al. | 331/1 A |

*Primary Examiner*—Tesfaldet Bocure

[57] ABSTRACT

A reference frequency generator is described which obtains its frequency accuracy from the network timing signal available on the public switched telephone network. A digital logic array compares the output of an oven-controlled crystal oscillator to the network timing signal in order to develop digital samples, the values of which represent the differences in frequency between the network timing signal and the output of the oscillator. A frequency error is computed in a processor by comparing each digital sample to an expected value. The frequency error is stored in a data set only if it is less than a predetermined threshold level, thereby immediately excluding samples which may be generated during an outage or impairment of the transmission system which delivers the network timing signal. The data set is used to compute a statistical best estimate of the frequency error, and this best estimate is then used to generate a voltage which is applied to a frequency-controlling input of the oven-controlled crystal oscillator.

10 Claims, 3 Drawing Sheets

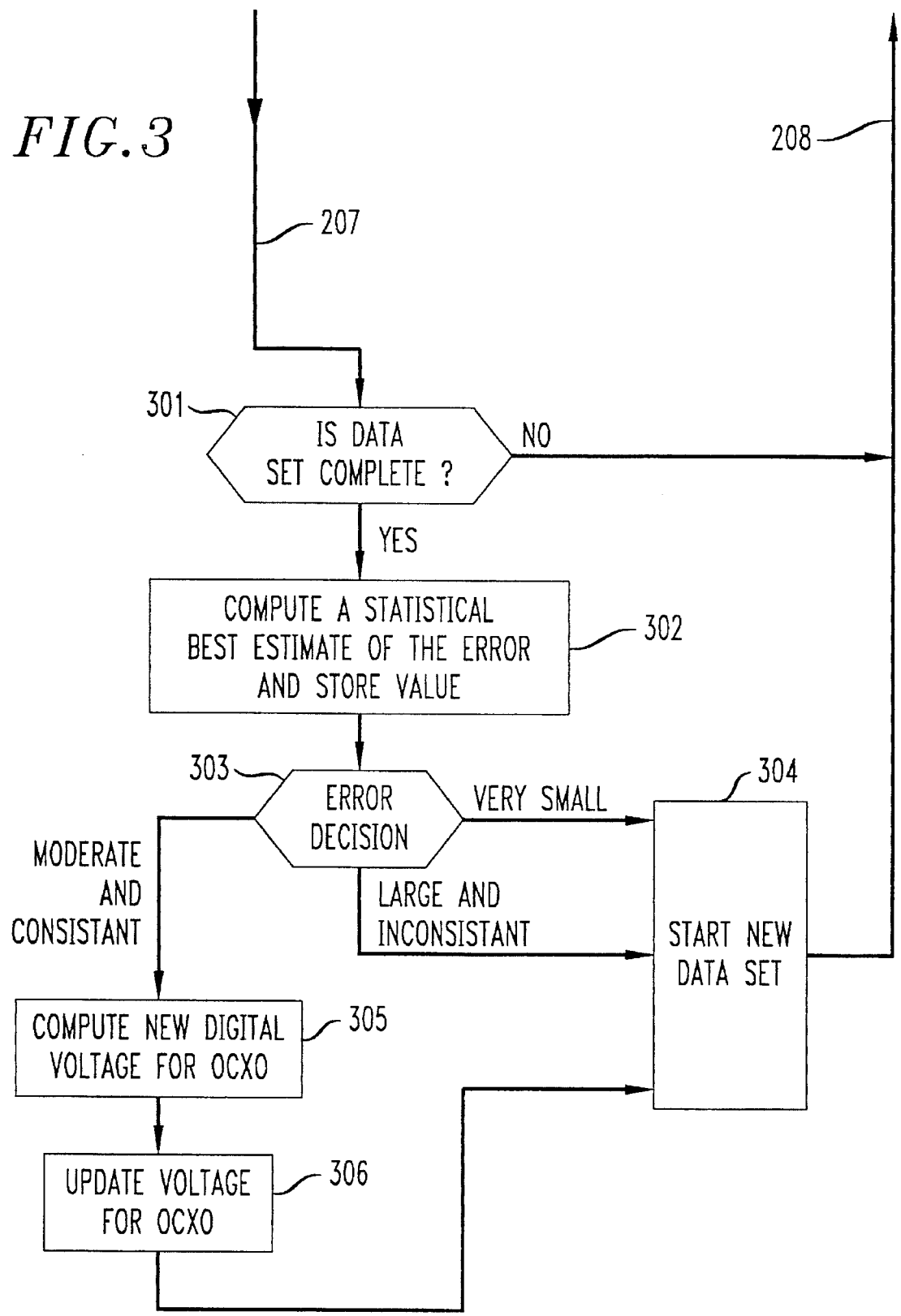

NETWORK-CONTROLLED REFERENCE FREQUENCY GENERATOR

FIELD OF THE INVENTION

This invention relates to reference frequency generators, and more particularly, to reference frequency generators that derive their frequency stability from the public switched telephone network.

DESCRIPTION OF THE RELATED ART

Cell sites that provide cellular telephone service require a radio frequency (RF) reference, such as 15 Mhz, which is highly accurate, typically to 0.05 ppm (parts per million). Current cell sites use redundant rubidium oscillators in order to achieve a long-term frequency stability of about $\pm 1 \times 10^{-11}$. Although this approach using rubidium oscillators easily achieves the desired frequency stability, it does so at a cost of several thousand dollars per site.

Each cellular site is generally coupled to a higher level in the public switched telephone network by way of a digital facility such as the T1 transmission system which provides a highly accurate sampling signal having a frequency of 8 Khz. This network timing signal has a frequency accuracy which is traceable to the National Institute of Standards and Technology and ultimately to international universal time, and therefore has the required frequency stability. It unfortunately suffers from the fact that the transmission system has random impairments and outages.

An oven-controlled crystal oscillator (OCXO) has a piezoelectric crystal in a controlled, elevated-temperature environment and is capable of providing a reference frequency having a stability of about 0.02 ppm for a very reasonable cost. Unfortunately, the OCXO suffers from the fact that, over long periods of time, the frequency at any given temperature will change due to aging.

SUMMARY OF THE INVENTION

A reference frequency generator whose output frequency is controlled by the accuracy of the network timing signal from the public switched telephone network is provided in accordance with the present invention wherein the output frequency of an oscillator, such as an oven-controlled crystal oscillator, is compared with the network timing signal to develop digital samples, the values of which represent differences in frequency between the reference frequency signal from the oscillator and the network timing signal. A frequency error is then computed by comparing the value of each sample to an expected value. A frequency error is then stored in a data set only if its magnitude is less than a predetermined threshold level, thereby immediately excluding errors that may be generated during an outage or impairment in the public switched telephone network. A statistical best estimate of the error is then developed, and only those errors within a predetermined range are used to update a signal which is applied to a frequency-controlling input of the oscillator.

It is an aspect of the present invention that high frequency jitter is removed from the digital samples prior to computation of the frequency error.

It is an additional aspect of the present invention that the statistical best estimate is computed in a processor which operates on a data set of stored frequency errors, and a nonvolatile memory stores information relating to the frequency-controlling input versus frequency characteristic for the oscillator.

BRIEF DESCRIPTION OF THE DRAWING

FIGS. 2 and 3 show a flow chart illustrating the operation of the processor 104 in FIG. 1.

DESCRIPTION OF THE PREFERRED EMBODIMENT

Figure 1:
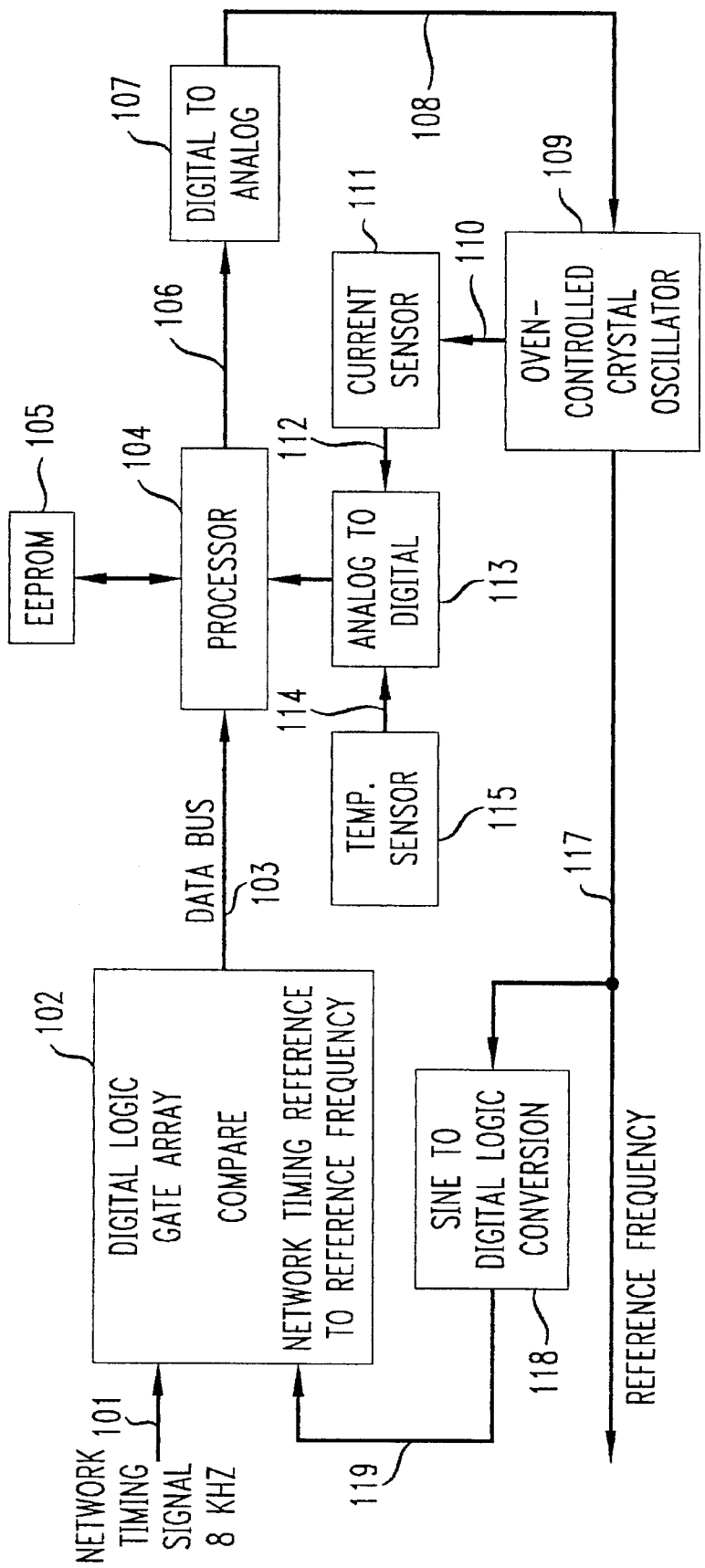
FIG. 1 is a schematic diagram showing Network-controlled reference frequency generator in accordance with the present invention.

In FIG. 1, a network timing signal of 8 khz, derived from a digital transmission system, such as a DS1 or T1 digital transmission system, is coupled by way of line 101 to the input of a digital logic gate array 102. This gate array may be either of the masked or programmable type. A second input of gate array 102 is connected to receive the digital logic level signals present on line 119 from the output of a sine to digital logic conversion circuit 118. Conversion circuit 118, in turn, has its input connected to receive the reference frequency signal of 15 Mhz present on line 117 from the output of an oven-controlled crystal oscillator 109, and develops a digital logic transition at its output each time that a zero crossing occurs in the reference frequency signal.

Digital logic gate array 102, which may be implemented using an AT&T 3090 FPGA, is designed or programmed to count the number of digital transitions which occur on line 119 relative to the timing voltage spikes occurring on line 101. As a result, gate array 102 operates as a frequency counter and develops digital samples, each one of which represents by its amplitude a measurement of the frequency difference between the reference frequency signal on line 117 and the network timing signal on line 101. In addition, the gate array 102 is designed to remove any high frequency jitter that may be present due to noise on the transmission medium that is delivering the network timing signal.

The resulting digital samples representing the filtered frequency difference between the network timing signal and the reference frequency signal on line 117 are transferred on data bus 103 to the input of a processor 104. Gate array 102 checks that the more significant data bits are as expected, and only the least significant digital bits of each sample are transferred over data bus 103, thereby saving on the number of data bits under consideration. The operation of processor 104 can best be described by referring to the flow chart provided by placing FIG. 2 above FIG. 3 and joining lines 207 and 208 of FIG. 2 to their extensions in FIG. 3. The first two steps in FIG. 2, steps 201 and 202, have already been described in connection with the digital gate array 102, and are included in the flow chart in order to more completely illustrate the steps which may be used to practice the present invention. As will be apparent to those skilled in the art, step 202 of removing the high frequency jitter which is accomplished in the present embodiment by the digital gate array 102 could very easily be performed by processor 104. Similarly, the step to be described hereinafter as computing the frequency error in connection with step 203 may be performed entirely or partially in digital logic array 102.

Figure 2:
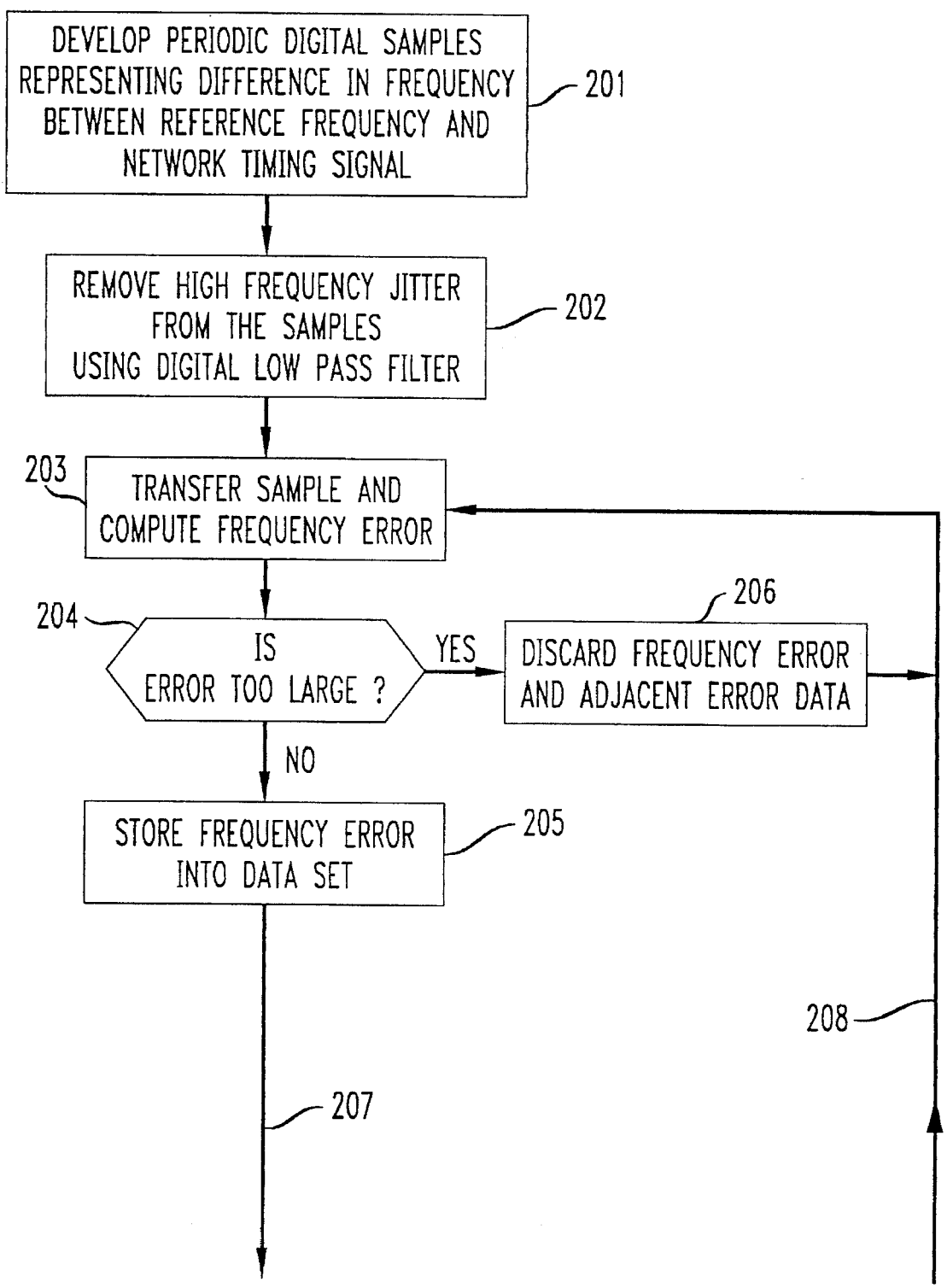

Processor 104 may be implemented by using an Intel microcontroller 80C51, and is programmed to perform the remainder of the steps illustrated in the flow chart provided by FIGS. 2 and 3. In step 203, data is transferred on bus 103, and processor 104 computes the frequency error which is defined herein as the difference between the value of a developed digital sample and an expected value. In the present embodiment where the reference frequency is 15 Mhz and the network timing reference is 8 khz, the expected value is $(15\times10^6/8\times10^3=)$ 1875. The computed frequency error is the data which is considered in the remainder of the process.

The computed frequency error is then compared in a decision step 204 to a threshold level. This threshold level is determined from knowledge of the changes that can occur in the network timing signal due to impairments in the transmission system. In other words, the threshold is set such that if the frequency error is greater than the threshold level, the frequency error is most likely due to an impairment or outage in the system. If step 204 determines that the error is too large, step 206 then operates to discard the frequency error under consideration and furthermore to remove previously stored error data representing the frequency errors from adjacent intervals. The nature of impairments in transmission systems is such that if an impairment occurs, there are likely to be overshoots and undershoots, and therefore the data adjacent to an impairment are suspect. After step 206, the process returns to step 203 to transfer an additional sample of data from the gate array.

If however, step 204 determines that the frequency error is not too large, (that is, that it is less than the threshold level) the frequency error is stored into a data set in step 205. The process then flows into decision step 301 wherein it is determined as to whether the data set is complete. The size of the data set is determined by the nature of impairments on the system, the stability of the OCXO, and the desired stability. For example, if an OCXO having higher stability is selected, a larger number of samples of data should be collected before the decision is made to change it. If however, in the interests of lower costs, an OCXO having lower stability is selected, a change may be required more frequently; therefore there is less time to collect data, and the data set would be made correspondingly smaller. If the data set is not complete, the process returns by way of line 208 to step 203 wherein another sample is transferred from the gate array 102 to be processed.

If however, it is determined in step 301 that the data set is complete, the process flows into step 302 wherein a statistical best estimate of the error is computed and stored together with the ambient temperature to form a set of best estimates. Ambient temperature is provided by a temperature sensor 115 to be described hereinafter. This new best estimate of the error is then considered within decision step 303. If the new best estimate of the error is determined to be very small, the process flows into step 304 wherein the previously stored errors in the data set are discarded and a new data set is started. The process then returns to step 203 to transfer the potentially first piece of data in a new data set. An error is by definition very small if it is less than the resolution capabilities of the digital to analog convertor 107 to be described hereinafter.

If it is determined in decision step 303 that the error is large and inconsistent with the set of previous estimates and with the type of change which would be expected to occur in OCXO 109 due to aging, the process again flows into step 304 to start a new data set.

If it is determined in step 303 that the error is moderate and consistent with the previous best estimates and with the type of changes which would be expected to occur due to aging in OCXO 109, then the process flows into step 305 wherein the new digital voltage to be applied to OCXO 109 is computed. The new digital voltage is computed by taking into consideration the nonlinear characteristics of OCXO 109 which have been stored into a nonvolatile memory, EEPROM 105 in FIG. 1. As indicated in FIG. 1, processor 104 is capable of storing this information in EEPROM 105 and is also capable of retrieving it. The process then flows into step 306 wherein the digital voltage is coupled to a digital to analog convertor 107 in FIG. 1 and then returns to step 304 to start a new data set.

Digital to analog convertor 107 in FIG. 1 translates the digital voltage from processor 104 into an analog value which when applied by way of line 108 to a frequency-controlling input of OCXO 109 causes it to provide a reference frequency signal that will eliminate the error which has been detected due to aging of OCXO 109. In this way oscillator 109 is essentially controlled by an intelligent feedback loop to the network timing signal. The feedback loop is intelligent in that it removes the effects of errors produced due to impairments and/or outages that may be present in the transmission system which delivers the network timing signal, and only corrects those differences which are due to aging of the OCXO.

A temperature sensor 115 in FIG. 1 is used to detect the ambient temperature. The output of this temperature sensor 115 is connected by way of line 114 to the input of an analog to digital encoder 113. A current sensor 111 is connected to OCXO 109 by way of line 110 to monitor the current which is used to energize the heating element in the OCXO. The output of current sensor 111 is connected by way of line 112 to a second input of analog to digital convertor 113. The digital values developed by analog to digital convertor 113 are coupled to processor 104 by way of bus 116. In a second process other than the one illustrated by the flow chart diagram of FIGS. 2 and 3, processor 104 advantageously monitors the ambient temperature and current to the heating element of the OCXO. As a result, this second process is caused to shut down the reference frequency generator when the ambient temperature is outside the limits within which frequency accuracy has been guaranteed to the Federal Communications Commission. In addition, small deviations in ambient temperature can be recognized as the cause for changes in the reference frequency, and proper corrections can be made to the reference frequency to correct for aging independent of temperature bias and/or to correct for temperature even under the circumstances where the network timing reference is having an impairment or outage. This second process is also caused to advantageously shut down the reference frequency generator when the heating current is not of the proper value.

What has been described herein above is an illustrative embodiment of the present invention. Numerous departures from the embodiment may be made by those skilled in the art without departing from the spirit and scope of the present invention. For example, the steps from the first mentioned process may be shared between the digital gate array and the processor in a fashion other than that which has been described. In addition, oscillators other than the oven-controlled crystal oscillator may be embodied within an intelligent feedback loop in order to take advantage of the inherent accuracy of the network timing signal.

What is claimed is:

1. Apparatus for generating a reference frequency signal in response to an external signal having the desired accuracy but suffering from outages or impairments, said apparatus comprising an oscillator means having an output signal and an input for receiving a control signal, and feedback means for coupling said control signal to the input of said oscillator means in response to a frequency comparison of said external signal and said output signal of said oscillator means, characterized in that said feedback means includes means responsive to said external signal output signal for developing samples at periodic intervals representing differences in frequency between said external signal and said output signal, means for comparing each one of said samples to an expected value to develop data representing a frequency error, and means responsive to said comparing means and operative upon the developed data for selectively discarding data which represent differences during said outages or impairments and for developing said control signal from data which is not discarded.

2. Apparatus for generating a reference frequency signal as defined in claim 1 wherein said means for selectively discarding data and for developing said control signal includes means for comparing the data developed from each one of said periodic intervals to a threshold level, and means for storing the compared data which are less than said threshold level into a data set.

3. Apparatus for generating a reference frequency signal as defined in claim 2 wherein said means for selectively discarding data and for developing said control signal further includes means for computing a statistical best estimate of the frequency error represented by the data in said data set, and means for using said statistical best estimate to change said control signal only when the computed statistical best estimate is within a predetermined range of statistical best estimates.

4. Apparatus for generating a reference frequency signal as defined in claim 1 wherein said means for developing samples at periodic intervals includes means for removing high frequency jitter from said samples.

5. Apparatus for generating a reference frequency signal as defined in claim 4 wherein said means for developing samples at periodic intervals is a digital logic gate array.

6. Apparatus for generating a reference frequency signal in response to an external signal having the desired accuracy but suffering from outages or impairments, said apparatus comprising an oscillator means having an output signal and an input for receiving a control signal, digital logic gate array means for developing samples at periodic intervals representing differences in frequency between said external signal and said output signal, a processor means for developing said control signal which is applied to the input of said oscillator means in response to selected samples from said digital logic array; said processor means including means for comparing each one of said developed digital samples from said digital logic array means to an expected value to develop a frequency error for said each one of said developed samples, means for comparing said frequency error to a predetermined threshold level, means responsive to said comparing means for storing said frequency error in a data set if it is less than said threshold level and for discarding said frequency error if it is greater than said threshold level, means for computing a statistical best estimate of frequency errors stored in said data set, and means responsive to a statistical best estimate within a predetermined range for developing the control signal which is applied to the input of said oscillator means.

7. Apparatus for generating a reference frequency signal as defined in claim 6 wherein said apparatus further includes a nonvolatile memory means for storing information relating to the control signal versus frequency characteristic for said oscillator means, and said processor means is responsive to the information stored in said nonvolatile memory means when developing said control signal.

8. A method of generating a reference frequency provided by a signal-controlled frequency generator in response to an external signal having the desired frequency accuracy except during outages or impairments, said method comprising the steps of developing periodic samples representing the difference in frequency between said reference frequency and said external signal, computing a frequency error for each one of said periodic samples by comparing the value of the sample to a predetermined expected value, storing said frequency error into a data set providing said frequency error is less than a predetermined threshold level, discarding said frequency error if said frequency error is greater than said predetermined threshold level, and developing a control signal for said reference frequency generator in response to a statistical best estimate of the frequency errors stored in said data set.

9. A method of generating a reference frequency as defined in claim 8 wherein said step of developing a control signal includes the step of selecting a statistical best estimate for use in developing said control signal only if the best estimate is within a predetermined range of statistical best estimates.

10. A method of generating a reference frequency as defined in claim 8 wherein said step of developing periodic samples includes the step of removing high frequency jitter from said samples.

* * * * *